(12) United States Patent
Lin (10) Patent No.: US 11,212,910 B1
(45) Date of Patent: Dec. 28, 2021

(54) HIGH FREQUENCY SIGNAL CROSS-LAYER TRANSMISSION STRUCTURE IN MULTI-LAYER PRINTED CIRCUIT BOARD

(71) Applicant: WANSHIH ELECTRONIC CO., LTD., New Taipei (TW)

(72) Inventor: Hung-Hsuan Lin, New Taipei (TW)

(73) Assignee: WANSHIH ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 17/110,990

(22) Filed: Dec. 3, 2020

(51) Int. Cl.
*H05K 1/02* (2006.01)
*H05K 1/11* (2006.01)

(52) U.S. Cl.
CPC .......... *H05K 1/0245* (2013.01); *H05K 1/024* (2013.01); *H05K 1/116* (2013.01); *H05K 2201/093* (2013.01)

(58) Field of Classification Search
CPC .. H05K 1/0245; H05K 1/0237; H05K 1/0239; H05K 1/025; H05K 1/0251; H05K 1/0253; H05K 1/024; H05K 2201/093
See application file for complete search history.

(56) References Cited

U.S. PATENT DOCUMENTS

| | | | | |
|---|---|---|---|---|
| 8,035,992 | B2 * | 10/2011 | Kushta | H01L 23/49827 361/818 |
| 8,309,863 | B2 * | 11/2012 | Kashiwakura | H05K 1/0251 174/261 |
| 8,895,872 | B2 * | 11/2014 | Pai | H05K 1/11 174/262 |
| 9,264,010 | B2 * | 2/2016 | Lee | H03H 7/17 |
| 10,709,013 | B2 * | 7/2020 | Kogo | H05K 1/115 |
| 2008/0093112 | A1 * | 4/2008 | Kushta | H05K 1/16 174/260 |

* cited by examiner

*Primary Examiner* — Hoa C Nguyen
(74) *Attorney, Agent, or Firm* — Chun-Ming Shih; HDLS IPR Services (57) ABSTRACT

A high frequency signal cross-layer transmission structure in a multi-layer printed circuit board includes a bottom metal layer, a middle metal layer and a top metal layer. The bottom metal layer includes a bottom ground plane and a bottom conductive area. The middle metal layer includes a middle ground plane. The top metal layer includes a top ground plane and a top conductive area. The bottom ground plane defines and surrounds a bottom annular clearance area. The middle ground plane defines and surrounds a middle clearance area. The top ground plane defines and surrounds a top annular clearance area. The bottom annular clearance area surrounds at least one part of the bottom conductive area. The top annular clearance area surrounds at least one part of the top conductive area. A size-shape of the top annular clearance area is different from a size-shape of the middle clearance area.

5 Claims, 11 Drawing Sheets

HIGH FREQUENCY SIGNAL CROSS-LAYER TRANSMISSION STRUCTURE IN MULTI-LAYER PRINTED CIRCUIT BOARD

BACKGROUND OF THE INVENTION

Field of the Invention

The present invention relates to a multi-layer printed circuit board, and especially relates to a high frequency signal cross-layer transmission structure in a multi-layer printed circuit board.

Description of the Related Art

In a multi-layer circuit board (such as a multi-layer printed circuit board) and low-temperature/high-temperature co-fired ceramic (LTCC/HTCC) structure, via holes (namely, via) are used to connect metals of different layers for signal transmission or grounding. If the signal is to be transmitted between different layers of the multi-layer circuit board, a plurality of the via holes are also required to form a cross-layer transmission structure. If the frequency of the transmitted signal is higher (for example, the millimeter wave, 30 GHz~300 GHz), or if the bandwidth of the transmitted signal is larger, the bad phenomena of the impedance discontinuity, the radiation loss, the resonance between substrates and the signal interaction coupling in the cross-layer transmission structure formed by the via holes are more serious.

The size parameters of the multi-layer circuit board must comply with the design rule set by the manufacturer, such as the minimum line width, the minimum line distance, the solder pad (namely, pad) size, the via hole diameter and the minimum size of the via hole annular ring and so on. The size parameters of the multi-layer circuit board that do not meet the design rule set by the manufacturer will cause the decrease of the yield rate of the finished products and the electrical characteristics to be unstable. The designer must have the concept of the microwave/millimeter wave circuits and have the circuit simulation/three-dimensional electromagnetic simulation software and so on, to design a cross-layer transmission structure that meets the design rule set by the manufacturer and has good electrical conduction characteristics in a specific frequency range.

Figure 1:
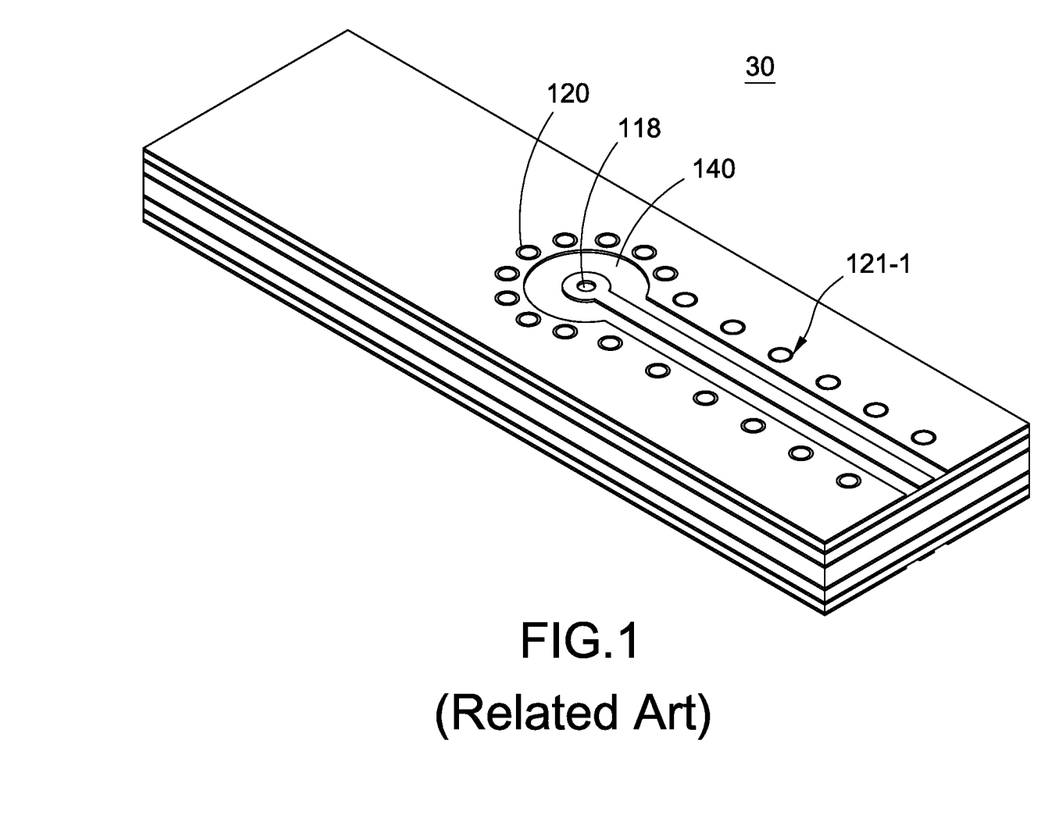
FIG. 1 shows an assembly drawing of an example of the related art multi-layer printed circuit board.
Figure 2:
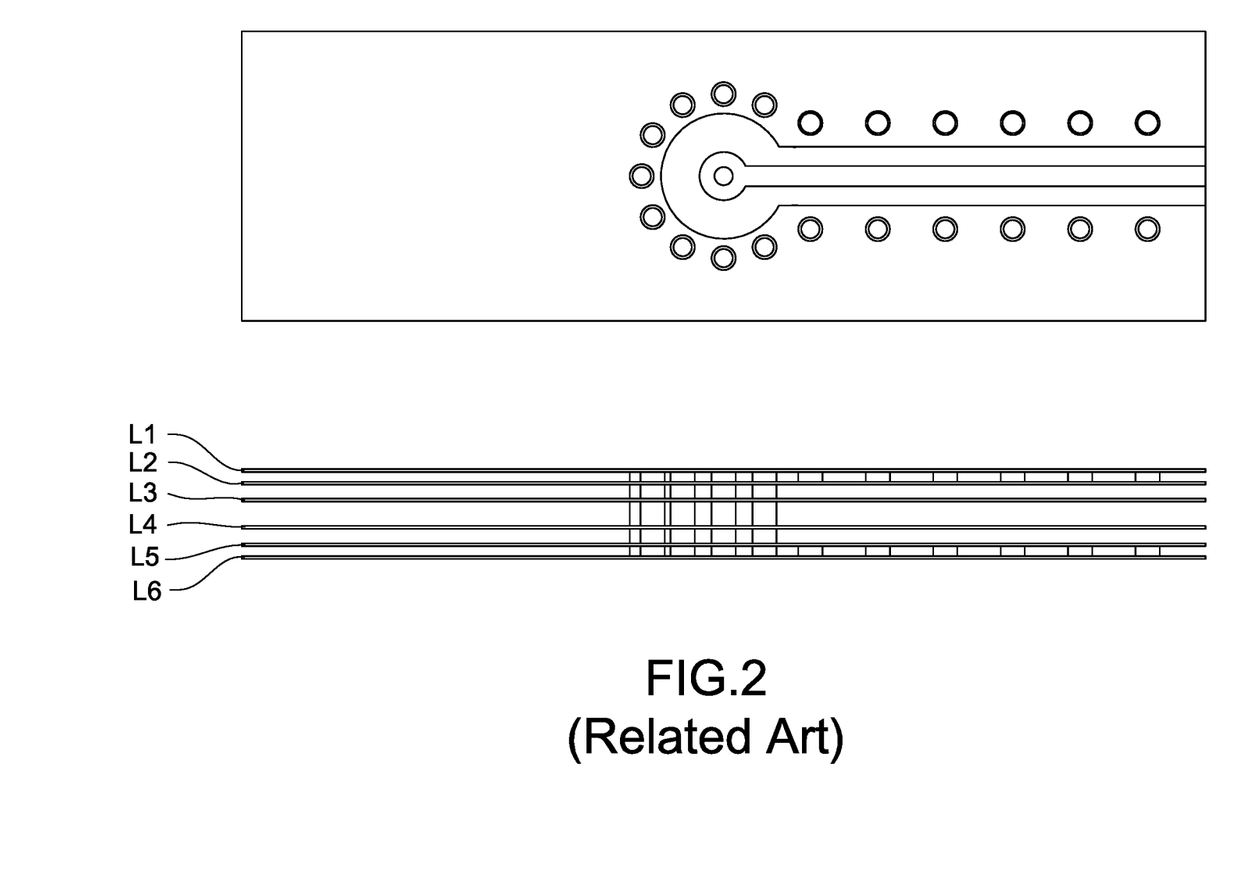
FIG. 2 shows a top perspective view and a side perspective view of an example of the related art multi-layer printed circuit board.
Figure 3:
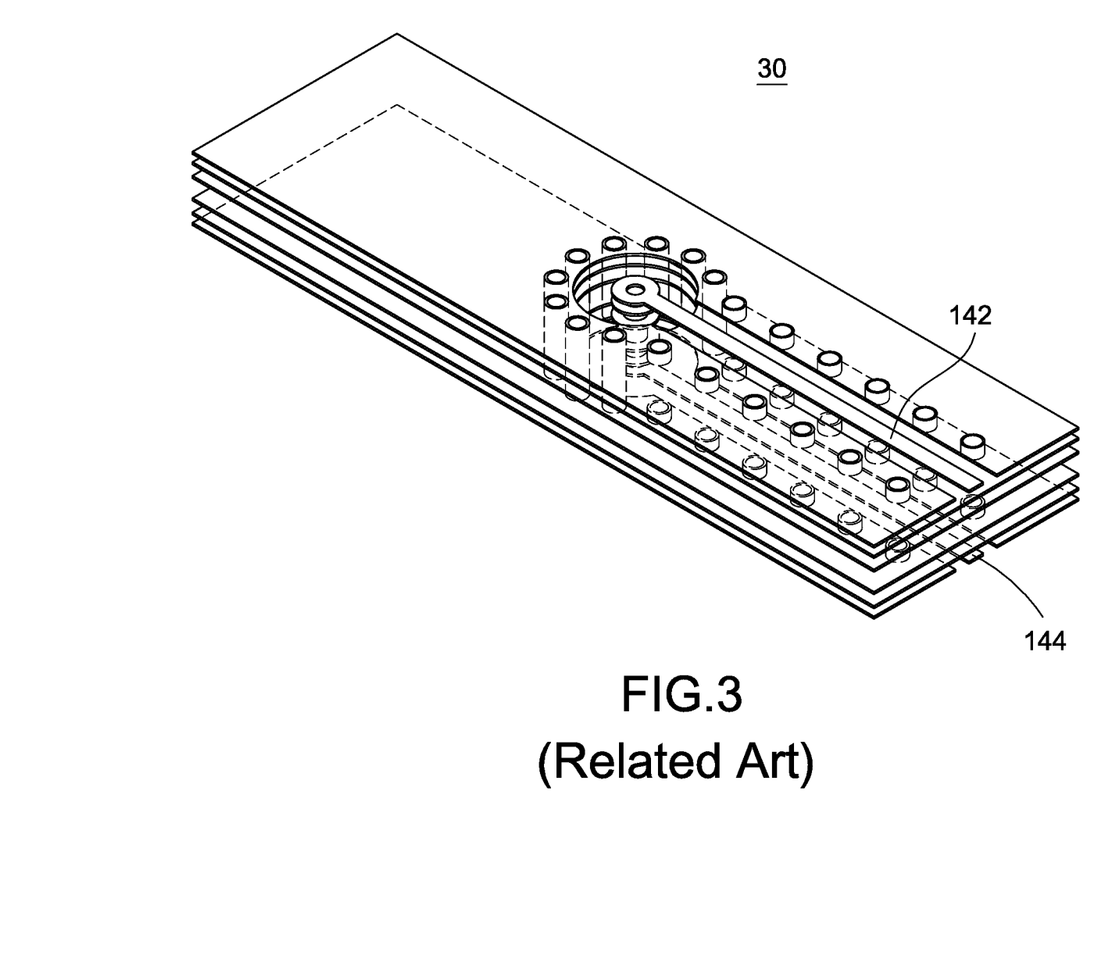
FIG. 3 shows a perspective view of an example of the related art multi-layer printed circuit board.
Figure 4:
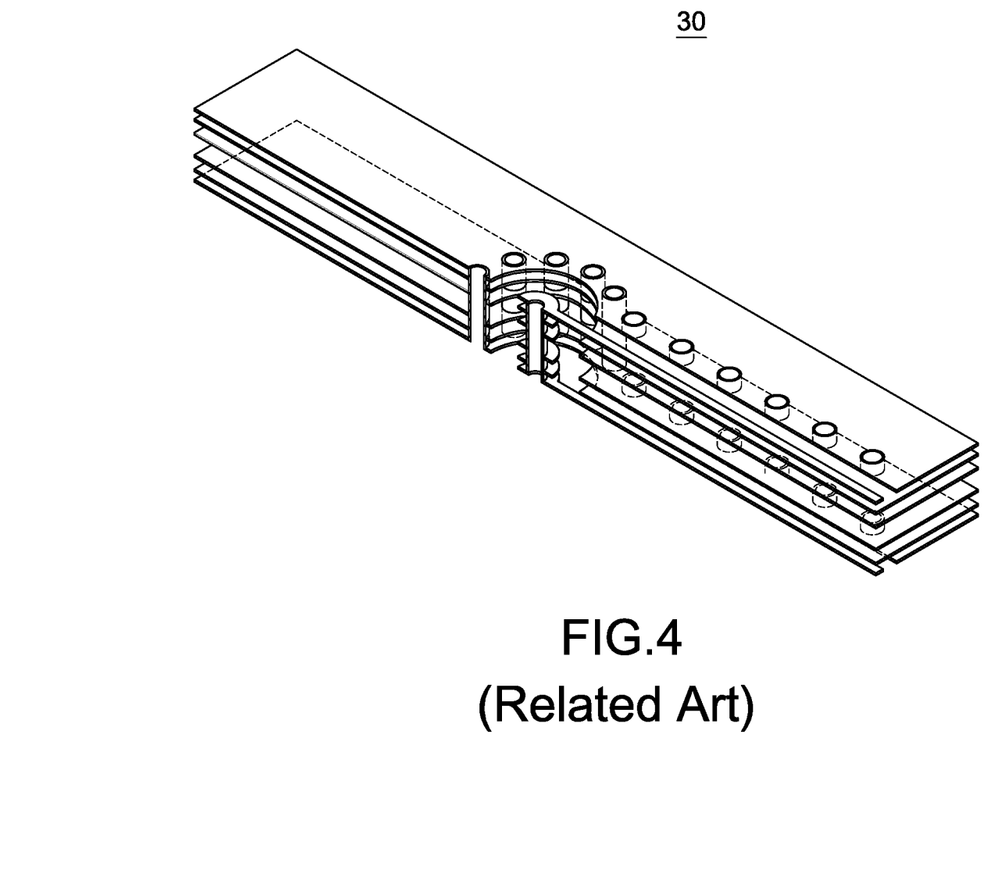
FIG. 4 shows a sectional perspective view of an example of the related art multi-layer printed circuit board.

FIG. 1 shows an assembly drawing of an example of the related art multi-layer printed circuit board. FIG. 2 shows a top perspective view and a side perspective view of an example of the related art multi-layer printed circuit board. FIG. 3 shows a perspective view of an example of the related art multi-layer printed circuit board. FIG. 4 shows a sectional perspective view of an example of the related art multi-layer printed circuit board.

A related art multi-layer printed circuit board 30 includes a top metal layer L1, a first middle metal layer L2, a second middle metal layer L3, a third middle metal layer L4, a fourth middle metal layer L5, a bottom metal layer L6, a top transmission line 142 and a bottom transmission line 144. The related art multi-layer printed circuit board 30 defines a center via hole 118, a clearance area 140, a plurality of ground via holes 120 and a plurality of top ground via holes 121-1. An area of the clearance area 140 is large, and the size/shape of the clearance area 140 in each layer is the same with others. The ground via holes 120 are intensive.

In a multi-layer circuit board, the cross-layer transmission structure for transmitting the high frequency signal generally includes the center via hole 118 to connect transmission lines of different metal layers. The ground via holes 120 are connected to the ground conductor of the radio frequency circuit to form a return path. The annular ring size of the via hole, the size of the ground via hole 120, the number of the ground via holes 120 and the spacing of the ground via holes 120 may be adjusted to control the equivalent impedance of the cross-layer transmission structure, so that the transmission frequency band has better transmission characteristics. In the design of the related art multi-layer circuit board, the signal cross-layer transmission structure (from the top layer to the bottom layer) requires more through holes (namely, through-hole via) to surround/form a C-shaped ground ring to prevent the high frequency signal from transmitting laterally in the substrate. This design limits the exit direction of the transmission line (namely, the top transmission line 142 and the bottom transmission line 144) and occupies a larger area, resulting in higher radiation leakage, higher loss and the interactive coupling between the adjacent transmission lines or components.

SUMMARY OF THE INVENTION

In order to solve the above-mentioned problems, an object of the present invention is to provide a high frequency signal cross-layer transmission structure in a multi-layer printed circuit board.

In order to achieve the object of the present invention mentioned above, the high frequency signal cross-layer transmission structure of the present invention includes a bottom metal layer, at least one middle metal layer and a top metal layer. The at least one middle metal layer is arranged on the bottom metal layer. The top metal layer is arranged on the at least one middle metal layer. Moreover, the bottom metal layer includes a bottom ground plane and a bottom conductive area. The at least one middle metal layer includes at least one middle ground plane. The top metal layer includes a top ground plane and a top conductive area. The bottom ground plane defines a bottom annular clearance area. The bottom ground plane surrounds the bottom annular clearance area. The at least one middle ground plane defines at least one middle clearance area. The at least one middle ground plane surrounds the at least one middle clearance area. The top ground plane defines a top annular clearance area. The top ground plane surrounds the top annular clearance area. The bottom annular clearance area surrounds at least one part of the bottom conductive area. The top annular clearance area surrounds at least one part of the top conductive area. A size of the top annular clearance area is different from a size of the at least one middle clearance area, or a shape of the top annular clearance area is different from a shape of the at least one middle clearance area, to adjust an impedance characteristic of the high frequency signal cross-layer transmission structure.

Moreover, in an embodiment of the high frequency signal cross-layer transmission structure of the present invention mentioned above, a size of the bottom annular clearance area is different from the size of the at least one middle clearance area, or a shape of the bottom annular clearance area is different from the shape of the at least one middle clearance area, to adjust the impedance characteristic of the high frequency signal cross-layer transmission structure.

Moreover, in an embodiment of the high frequency signal cross-layer transmission structure of the present invention mentioned above, the bottom conductive area and the top conductive area define a center via hole. The bottom conductive area and the top conductive area surround the center via hole. The center via hole is through the bottom conductive area and the top conductive area. The bottom conductive area and the top conductive area are connected to each other through the center via hole.

Moreover, in an embodiment of the high frequency signal cross-layer transmission structure of the present invention mentioned above, the bottom ground plane, the at least one middle ground plane and the top ground plane define a plurality of ground via holes. The bottom ground plane, the at least one middle ground plane and the top ground plane surround the ground via holes. The bottom ground plane, the at least one middle ground plane and the top ground plane are connected to the ground via holes.

Moreover, in an embodiment of the high frequency signal cross-layer transmission structure of the present invention mentioned above, the at least one middle ground plane defines at least one radial slot in the at least one middle clearance area. The at least one middle ground plane surrounds the at least one radial slot.

Moreover, in an embodiment of the high frequency signal cross-layer transmission structure of the present invention mentioned above, the bottom conductive area is a transmission line structure. The top conductive area is a transmission line structure.

Moreover, in an embodiment of the high frequency signal cross-layer transmission structure of the present invention mentioned above, the high frequency signal cross-layer transmission structure is applied to an electronic component. Moreover, the high frequency signal cross-layer transmission structure further includes at least one electronic component solder pad. The at least one electronic component solder pad is connected to the bottom conductive area or the top conductive area.

Moreover, in an embodiment of the high frequency signal cross-layer transmission structure of the present invention mentioned above, the bottom metal layer defines a bottom isolation slot. The at least one middle metal layer defines at least one middle isolation slot. The top metal layer defines a top isolation slot. The bottom isolation slot surrounds the bottom ground plane and the ground via holes. The at least one middle isolation slot surrounds the at least one middle ground plane and the ground via holes. The top isolation slot surrounds the top ground plane and the ground via holes.

Moreover, in an embodiment of the high frequency signal cross-layer transmission structure of the present invention mentioned above, the center via hole and the ground via holes are a plurality of plated through holes.

The advantage of the present invention is that the high frequency signal cross-layer transmission structure has a better high frequency signal conduction characteristic in a specific frequency band.

Please refer to the detailed descriptions and figures of the present invention mentioned below for further understanding the technology, method and effect of the present invention achieving the predetermined purposes. It believes that the purposes, characteristic and features of the present invention can be understood deeply and specifically. However, the figures are only for references and descriptions, but the present invention is not limited by the figures.

DETAILED DESCRIPTION OF THE INVENTION

Figure 9:
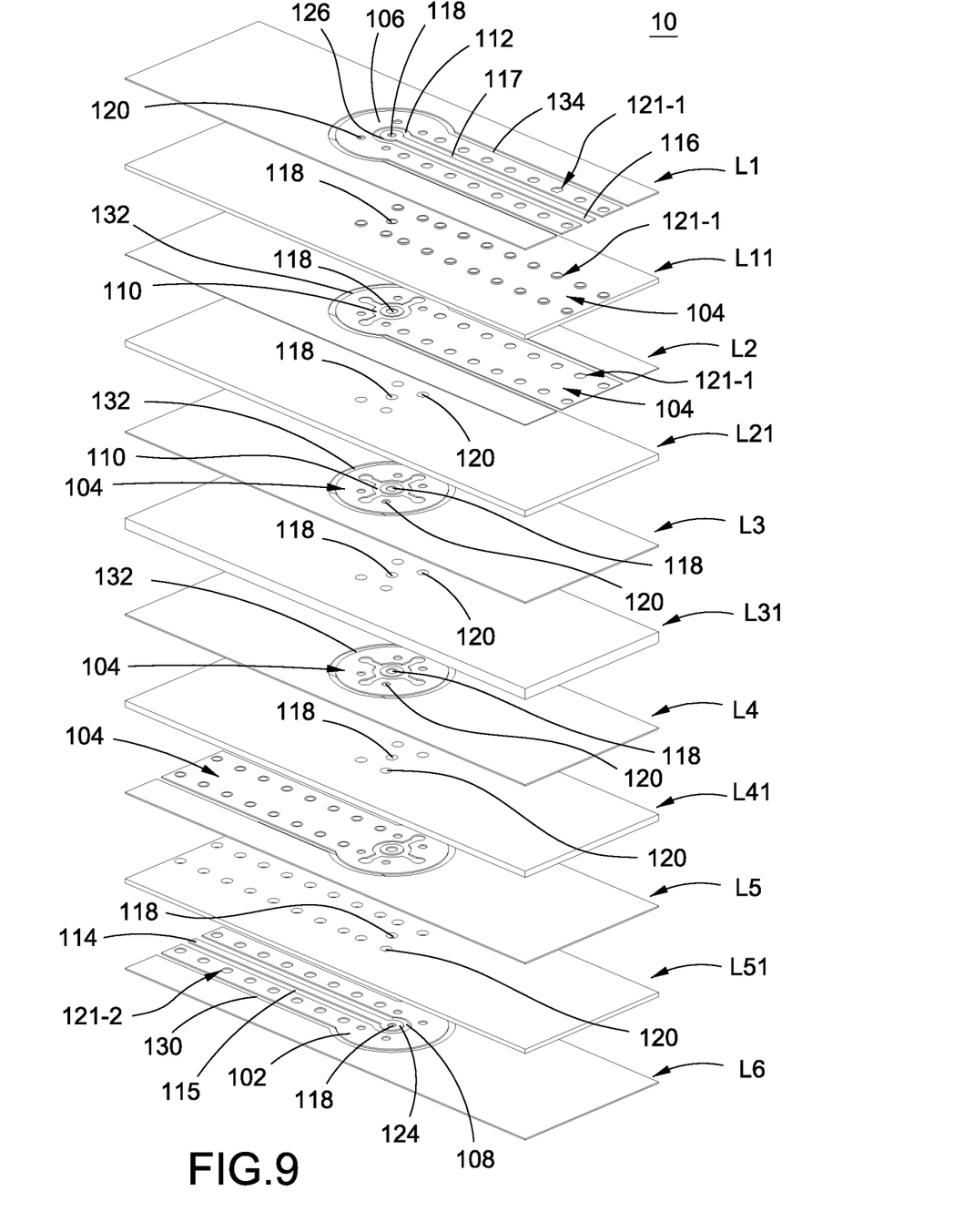
FIG. 9 shows an exploded view of an embodiment of the high frequency signal cross-layer transmission structure of the present invention.

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Now please refer to the figures for the explanation of the technical content and the detailed description of the present invention:

FIG. 9 shows an exploded view of an embodiment of the high frequency signal cross-layer transmission structure of the present invention. A high frequency signal cross-layer transmission structure 10 in a multi-layer printed circuit board of the present invention includes a top metal layer L1, at least one middle metal layer L2~L5 (namely, a first middle metal layer L2, a second middle metal layer L3, a third middle metal layer L4 and a fourth middle metal layer L5), a bottom metal layer L6, a first dielectric layer L11, a second dielectric layer L21, a third dielectric layer L31, a fourth dielectric layer L41 and a fifth dielectric layer L51.

The top metal layer L1 is arranged on the at least one middle metal layer L2~L5. The at least one middle metal layer L2~L5 is arranged on the bottom metal layer L6. More specifically, the top metal layer L1 is arranged on the first dielectric layer L11; the first dielectric layer L11 is arranged on the first middle metal layer L2; the first middle metal layer L2 is arranged on the second dielectric layer L21; the second dielectric layer L21 is arranged on the second middle metal layer L3; the second middle metal layer L3 is arranged on the third dielectric layer L31; the third dielectric layer L31 is arranged on the third middle metal layer L4; the third middle metal layer L4 is arranged on the fourth dielectric layer L41; the fourth dielectric layer L41 is arranged on the fourth middle metal layer L5; the fourth middle metal layer L5 is arranged on the fifth dielectric layer L51; the fifth dielectric layer L51 is arranged on the bottom metal layer L6.

The bottom metal layer L6 includes a bottom ground plane 102 and a bottom conductive area 114. The at least one middle metal layer L2~L5 includes at least one middle ground plane 104. The top metal layer L1 includes a top ground plane 106 and a top conductive area 116. The bottom ground plane 102 defines a bottom annular clearance area 108 and a bottom conductive slot 115. The bottom ground plane 102 surrounds the bottom annular clearance area 108 and the bottom conductive slot 115. The at least one middle ground plane 104 defines at least one middle clearance area 110. The at least one middle ground plane 104 surrounds the at least one middle clearance area 110. The top ground plane 106 defines a top annular clearance area 112 and a top conductive slot 117. The top ground plane 106 surrounds the top annular clearance area 112 and the top conductive slot 117. The bottom conductive slot 115 surrounds at least one part of the bottom conductive area 114. The top conductive slot 117 surrounds at least one part of the top conductive area 116.

A size of the top annular clearance area 112 is different from a size of the at least one middle clearance area 110, or a shape of the top annular clearance area 112 is different from a shape of the at least one middle clearance area 110, to adjust an impedance characteristic of the high frequency signal cross-layer transmission structure 10, so that the high frequency signal cross-layer transmission structure 10 has a better high frequency signal conduction characteristic in a specific frequency band. A size of the bottom annular clearance area 108 is different from the size of the at least one middle clearance area 110, or a shape of the bottom annular clearance area 108 is different from the shape of the at least one middle clearance area 110, to adjust the impedance characteristic of the high frequency signal cross-layer transmission structure 10, so that the high frequency signal cross-layer transmission structure 10 has the better high frequency signal conduction characteristic in the specific frequency band.

The bottom conductive area 114 and the top conductive area 116 define a center via hole (namely, center via) 118. The bottom conductive area 114 and the top conductive area 116 surround the center via hole 118. The center via hole 118 is through the top metal layer L1/the top conductive area 116, the first dielectric layer L11, the second dielectric layer L21, the third dielectric layer L31, the fourth dielectric layer L41, the fifth dielectric layer L51 and the bottom metal layer L6/the bottom conductive area 114. The top conductive area 116, the first dielectric layer L11, the second dielectric layer L21, the third dielectric layer L31, the fourth dielectric layer L41, the fifth dielectric layer L51 and the bottom conductive area 114 are connected to each other through the center via hole 118.

The bottom ground plane 102, the at least one middle ground plane 104, the top ground plane 106, the first dielectric layer L11, the second dielectric layer L21, the third dielectric layer L31, the fourth dielectric layer L41 and the fifth dielectric layer L51 define a plurality of ground via holes (namely, ground via) 120. The top ground plane 106, the first dielectric layer L11 and the at least one middle ground plane 104 (namely, the first middle metal layer L2) define a plurality of top ground via holes 121-1. The bottom ground plane 102, the fifth dielectric layer L51 and the at least one middle ground plane 104 (namely, the fourth middle metal layer L5) define a plurality of bottom ground via holes 121-2. The bottom ground plane 102, the at least one middle ground plane 104 and the top ground plane 106 surround the ground via holes 120. The bottom ground plane 102, the at least one middle ground plane 104 and the top ground plane 106 are connected to the ground via holes 120. The ground via holes 120 are through the top metal layer L1, the at least one middle metal layer L2~L5, the first dielectric layer L11, the second dielectric layer L21, the third dielectric layer L31, the fourth dielectric layer L41, the fifth dielectric layer L51 and the bottom metal layer L6. The top ground via holes 121-1 are through the top ground plane 106, the first dielectric layer L11 and the first middle metal layer L2. The bottom ground via holes 121-2 are through the bottom ground plane 102, the fifth dielectric layer L51 and the fourth middle metal layer L5.

The bottom conductive area 114 includes a bottom annular ring 124. The bottom annular ring 124 surrounds the center via hole 118. The top conductive area 116 includes a top annular ring 126. The top annular ring 126 surrounds the center via hole 118. According to the impedance characteristic and the manufacturer's printed circuit board process specifications, the at least one middle metal layer L2~L5 may also have the annular ring mentioned above. The bottom conductive area 114 is a transmission line structure. The top conductive area 116 is a transmission line structure.

The bottom metal layer L6 defines a bottom isolation slot 130. The at least one middle metal layer L2~L5 define at least one middle isolation slot 132. The top metal layer L1 defines a top isolation slot 134. The bottom isolation slot 130 surrounds the bottom ground plane 102 and the ground via holes 120. The at least one middle isolation slot 132 surrounds the at least one middle ground plane 104 and the ground via holes 120. The top isolation slot 134 surrounds the top ground plane 106 and the ground via holes 120. The center via hole 118 and the ground via holes 120 are a plurality of plated through holes (namely, plating through holes).

Figure 5:
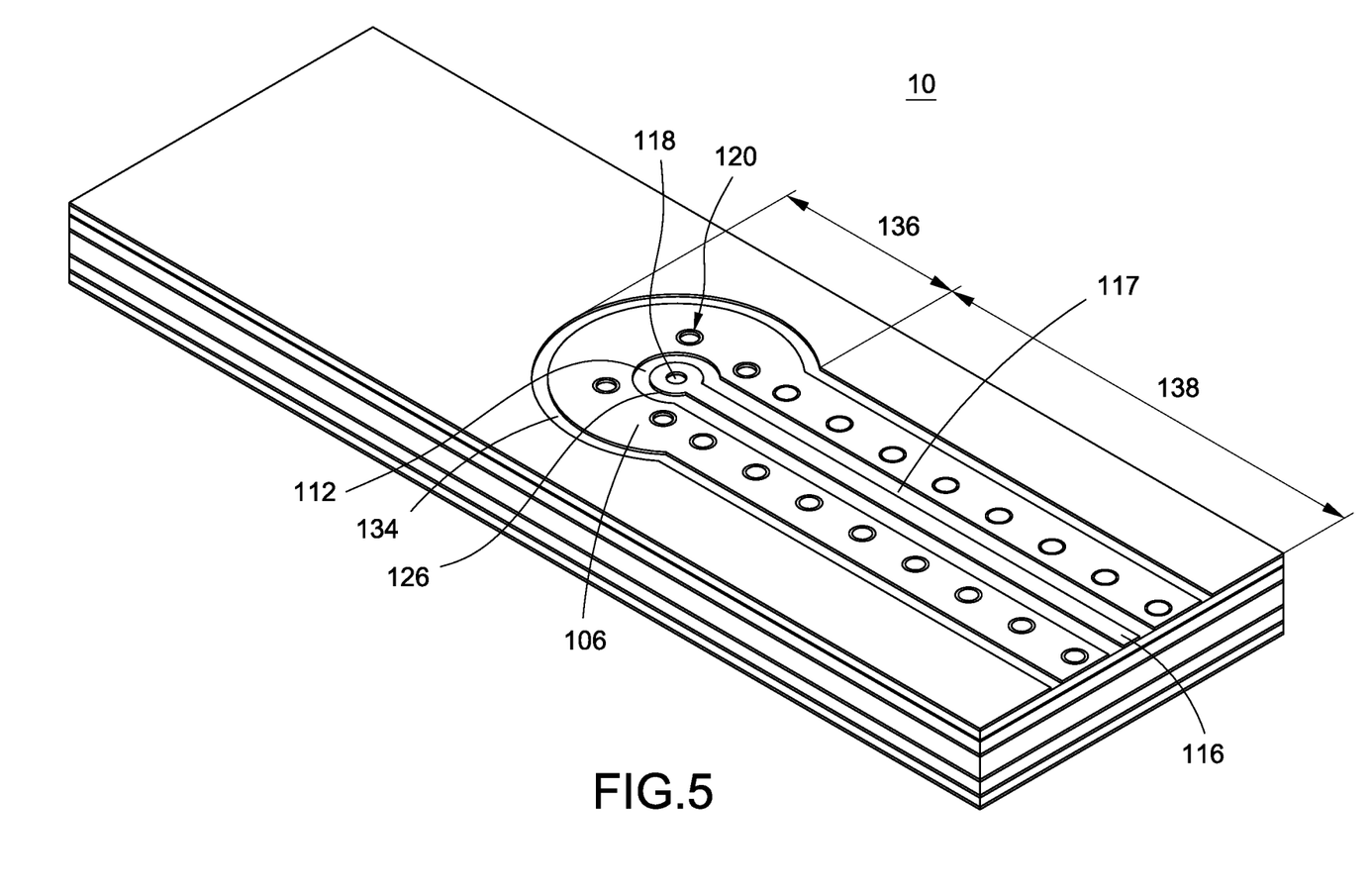
FIG. 5 shows an assembly drawing of an embodiment of the high frequency signal cross-layer transmission structure of the present invention.

FIG. 5 shows an assembly drawing of an embodiment of the high frequency signal cross-layer transmission structure of the present invention. FIG. 5 shows a transition section 136 and a transmission line section 138.

Figure 6:
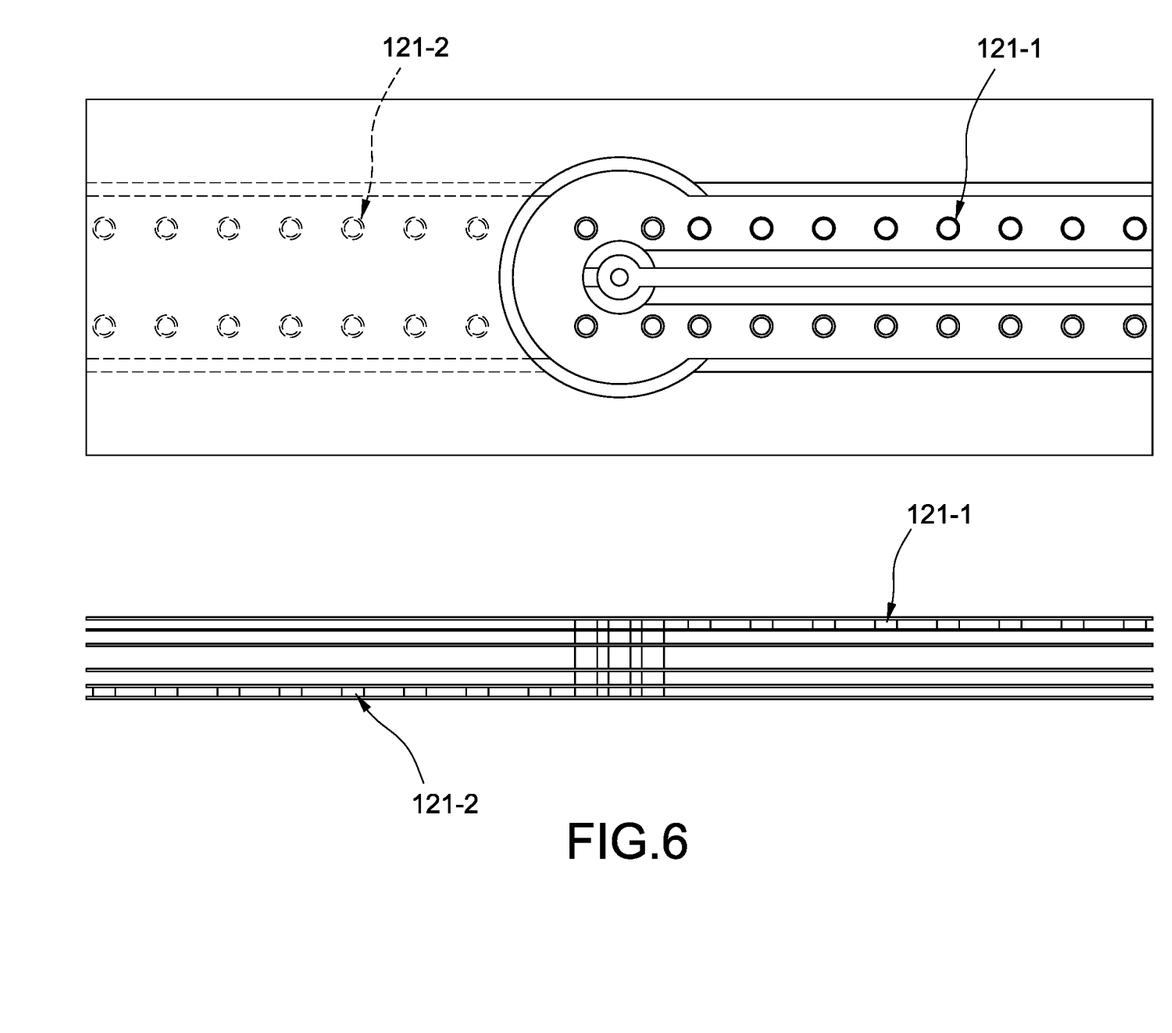
FIG. 6 shows a top perspective view and a side perspective view of an embodiment of the high frequency signal cross-layer transmission structure of the present invention.

FIG. 6 shows a top perspective view and a side perspective view of an embodiment of the high frequency signal cross-layer transmission structure of the present invention. FIG. 6 mainly shows the top ground via holes 121-1 of the top metal layer L1 and the first middle metal layer L2, and mainly shows the bottom ground via holes 121-2 of the fourth middle metal layer L5 and the bottom metal layer L6.

Figure 7:
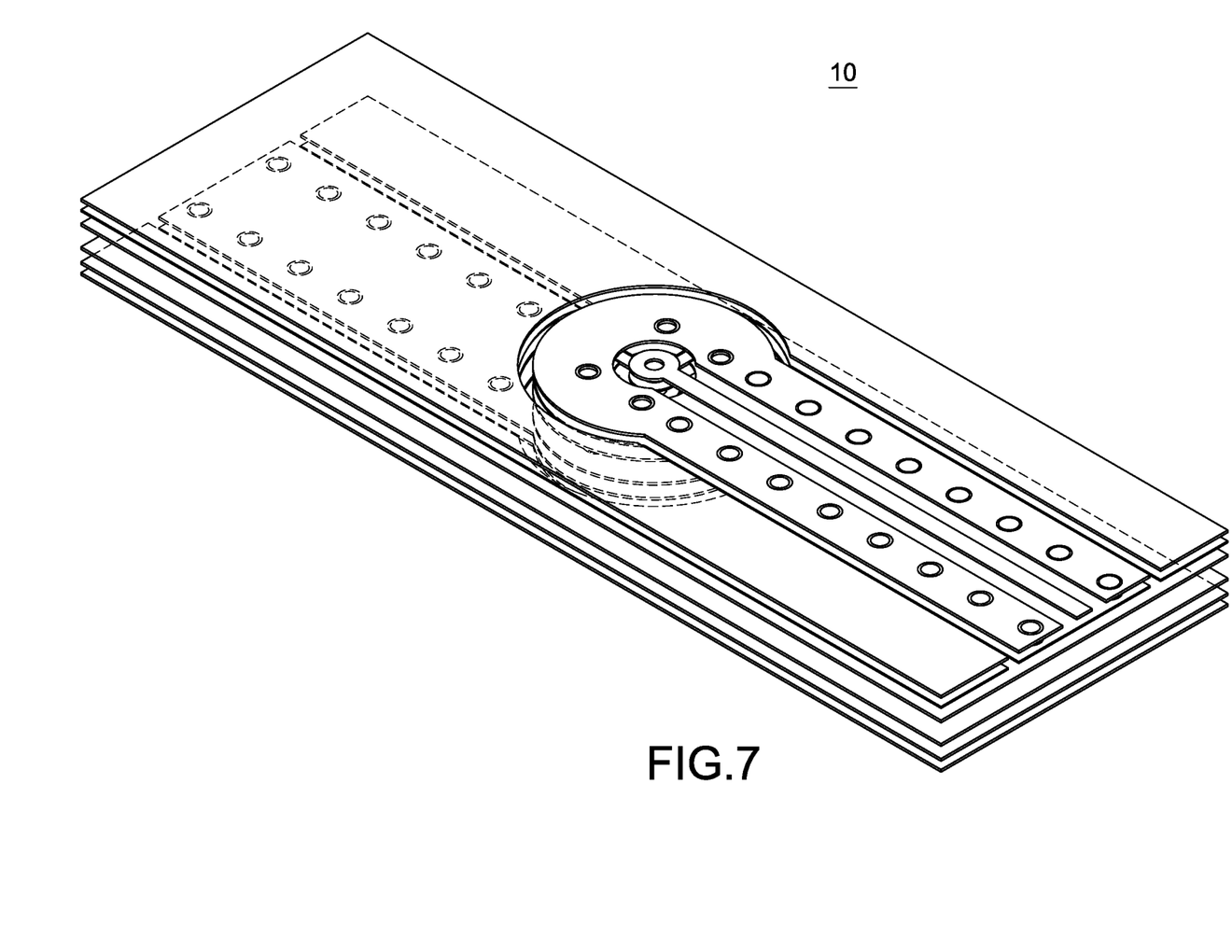
FIG. 7 shows a perspective view of an embodiment of the high frequency signal cross-layer transmission structure of the present invention.
Figure 8:
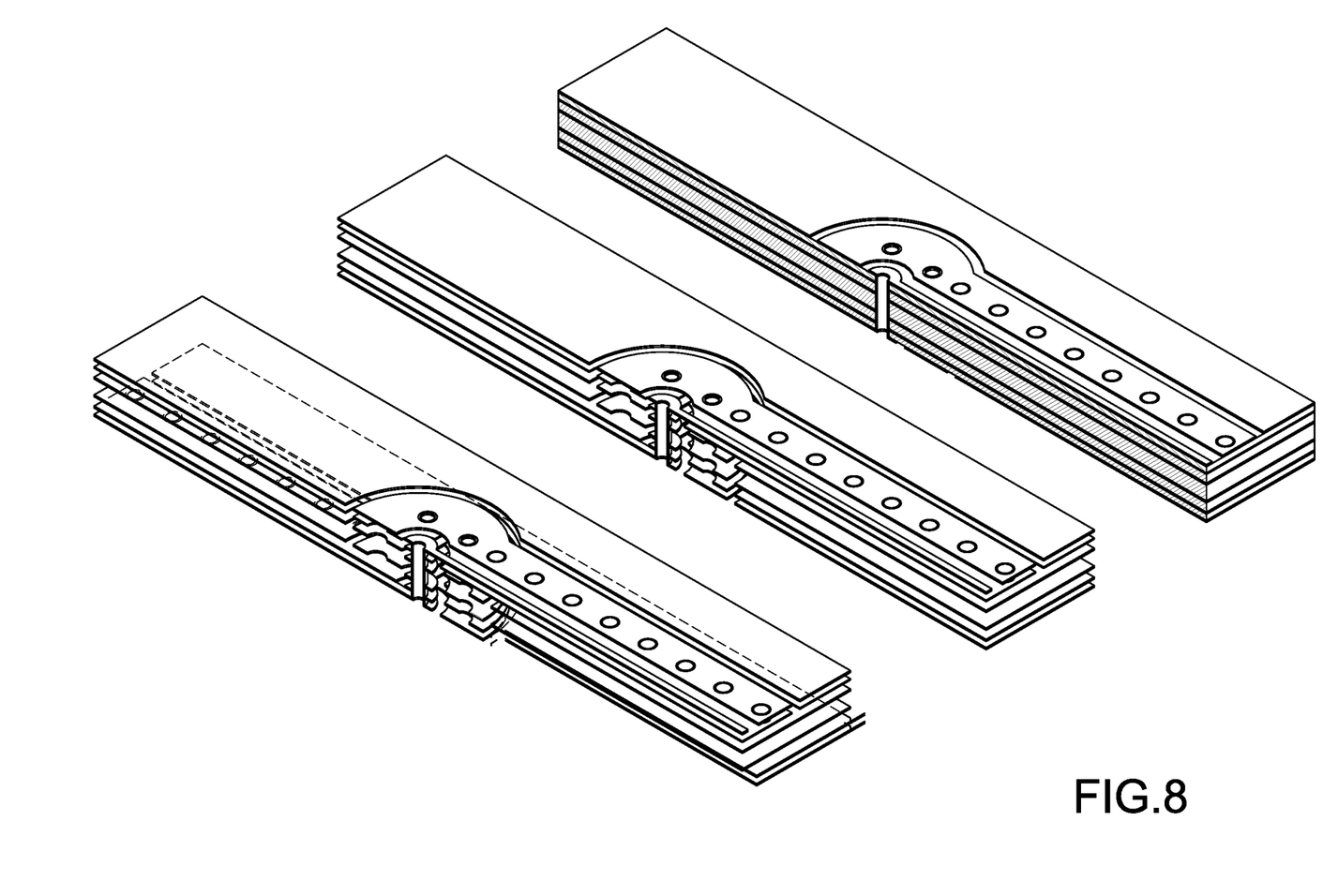
FIG. 8 shows a sectional perspective view of an embodiment of the high frequency signal cross-layer transmission structure of the present invention.

FIG. 7 shows a perspective view of an embodiment of the high frequency signal cross-layer transmission structure of the present invention. FIG. 8 shows a sectional perspective view of an embodiment of the high frequency signal cross-layer transmission structure of the present invention.

Figure 10:
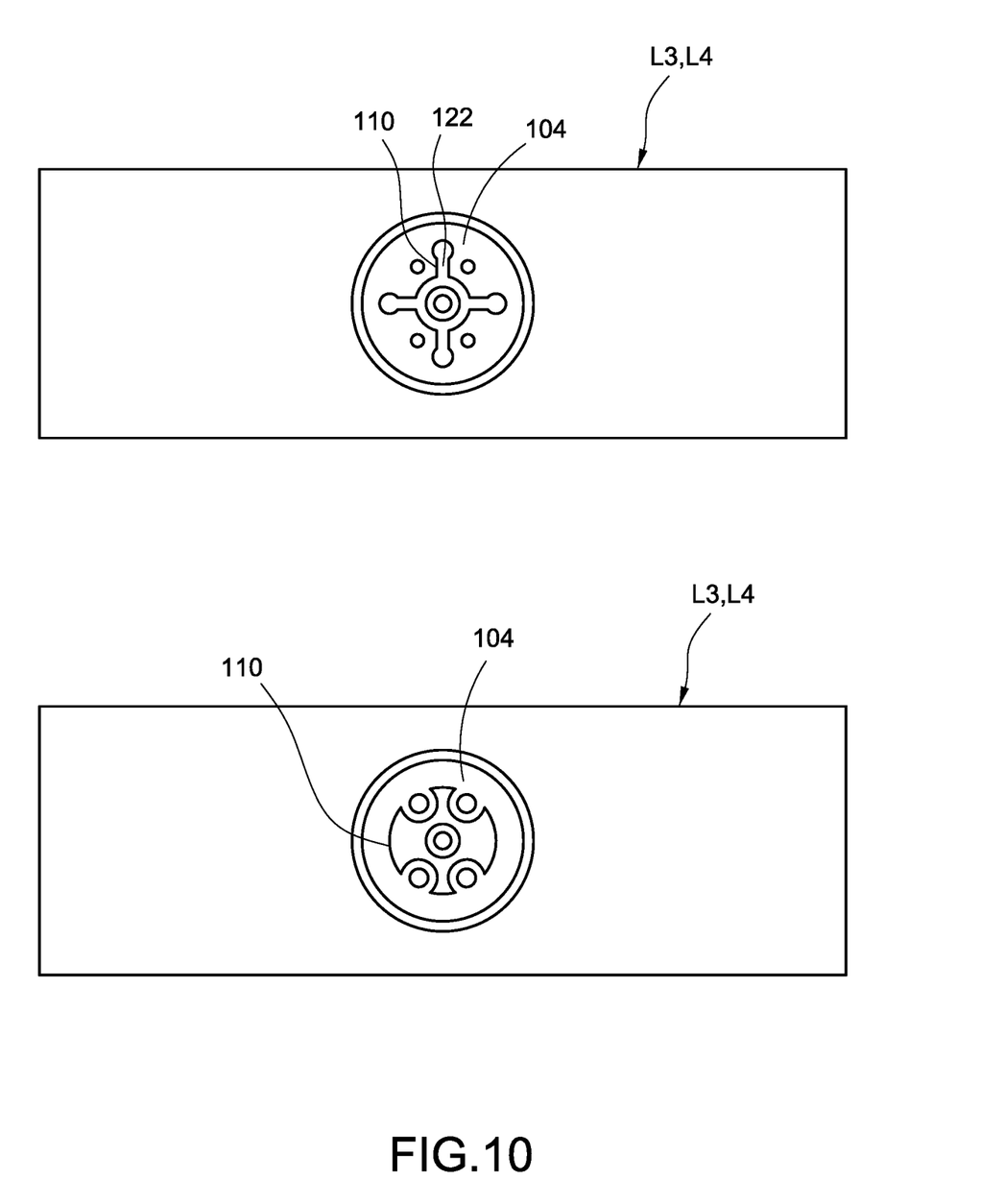
FIG. 10 shows a top view of an embodiment of the second middle metal layer or the third middle metal layer of the present invention.

FIG. 10 shows a top view of an embodiment of the second middle metal layer or the third middle metal layer of the present invention. The at least one middle ground plane 104 defines at least one radial slot 122 (in the upper part of FIG. 10) in the at least one middle clearance area 110. The at least one middle ground plane 104 surrounds the at least one radial slot 122.

Figure 11:
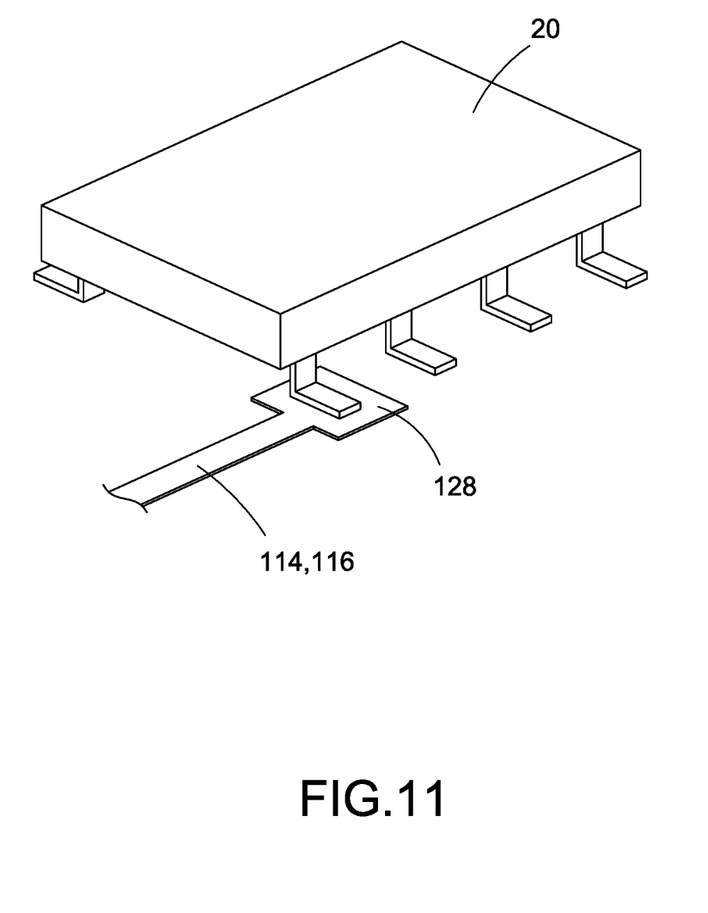
FIG. 11 shows an application drawing of an embodiment of the present invention.

FIG. 11 shows an application drawing of an embodiment of the present invention. The high frequency signal cross-layer transmission structure 10 is applied to an electronic component 20. The high frequency signal cross-layer transmission structure 10 further includes at least one electronic component solder pad 128. The at least one electronic component solder pad 128 is connected to the bottom conductive area 114 or the top conductive area 116.

In summary, the present invention is a new cross-layer transmission structure design, ingeniously designing the arrangement of the through holes of the multi-layer printed circuit board and the metal pattern of each layer. Please refer to FIG. 5~FIG. 11 again. The present invention includes the following features:

1. The ground via holes 120 are concentrated toward the center via hole 118 as much as possible, so as to reduce the difference of the return path to obtain the better bandwidth characteristics.

2. The bottom annular clearance area 108 and the top annular clearance area 112 are reduced, so that the radiation leakage to the outside air can be reduced.

3. The at least one middle clearance area 110 is appropriately enlarged, or the radial slot 122 is increased, to adjust the impedance of the cross-layer transmission structure.

4. The isolation slots (namely, the bottom isolation slot 130, the at least one middle isolation slot 132 and the top isolation slot 134) are added to the periphery of the ground via holes 120 of the ground planes (namely, the bottom ground plane 102, the at least one middle ground plane 104 and the top ground plane 106) of each layer to suppress the lateral leakage of the high frequency signal along the ground metal.

Combining the features mentioned above, the new cross-layer transmission structure design of the present invention can have the better transmission characteristics in the specific frequency band and a flexible transmission line outlet direction.

The embodiments of FIG. 5~FIG. 11 include six metal layers to form the high frequency signal cross-layer transmission structure 10 of the present invention. The six metal layers are the top metal layer L1, the first middle metal layer L2, the second middle metal layer L3, the third middle metal layer L4, the fourth middle metal layer L5 and the bottom metal layer L6 in order from top to bottom. The high frequency signal is connected/transmitted to the cross-layer structure through two transmission lines (namely, the top conductive area 116 and the bottom conductive area 114) of the top metal layer L1 and the bottom metal layer L6 to be transmitted across layers. However, the connection/transmission to the cross-layer transmission structure is not limited to any form of transmission lines, and it can also be an integrated circuit (IC) or a pin solder pad (namely, the at least one electronic component solder pad 128) of an electronic component, even integrated into the form of via-in-pad.

The transmission lines (namely, the top conductive area 116 and the bottom conductive area 114) of the top metal layer L1 and the bottom metal layer L6 are in the form of the microstrip line. The first middle metal layer L2 and the fourth middle metal layer L5 respectively has the corresponding middle ground plane 104, but in order to further reduce the cross coupling of the high frequency signals, the top metal layer L1 and the first middle metal layer L2 also respectively has the auxiliary ground plane (namely, the top ground plane 106 and the bottom ground plane 102). The top ground plane 106 is connected to the middle ground plane 104 of the first middle metal layer L2 through the top ground via holes 121-1 of the top metal layer L1 and the first middle metal layer L2. The bottom ground plane 102 is connected to the middle ground plane 104 of the fourth middle metal layer L5 through the bottom ground via holes 121-2 of the fourth middle metal layer L5 and the bottom metal layer L6. Therefore, a structure similar to grounded coplanar waveguide (GCPW) can be formed.

There is usually a plurality of the ground planes distributed on each metal layer and connected to the ground via holes 120. In the embodiment, the top metal layer L1 and the bottom metal layer L6 are metal layers having the transmission line (namely, the top conductive area 116 and the bottom conductive area 114). The ground planes (namely, the top ground plane 106 and the bottom ground plane 102) of the top metal layer L1 and the bottom metal layer L6 are respectively connected to the auxiliary radio frequency ground of the top metal layer L1 and the bottom metal layer L6. Compared with the conventional design, the bottom annular clearance area 108 and the top annular clearance area 112 have smaller sizes to reduce the radiation loss.

The at least one middle clearance area 110 of the at least one middle metal layer L2~L5 (namely, the first middle metal layer L2, the second middle metal layer L3, the third middle metal layer L4 and the fourth middle metal layer L5) changes the size or the shape to adjust the characteristics. The at least one middle clearance area 110 may be equal to the top annular clearance area 112 plus the additional radial slot 122, or the at least one middle clearance area 110 may directly enlarge the size of the top annular clearance area 112, but remain the ground via holes 120. In the present invention, the at least one middle clearance area 110 is adjustable for different thickness of the board dielectric layer, the printed circuit board stack layers with different materials or the printed circuit board stack layers with different dielectric constants, in order to optimize the electrical characteristics of the high frequency signal cross-layer transmission structure 10 corresponding to the required frequency range.

The ground via holes 120 are arranged sparsely/dispersely to provide the at least one middle clearance area 110 with a larger variation space, but the high frequency signal may easily propagate in the substrate. In order to solve such problems, the present invention provides the isolation slots (namely, the bottom isolation slot 130, the at least one middle isolation slot 132 and the top isolation slot 134) to suppress the resonance and the signal interaction coupling caused by the lateral propagation of the high frequency signal in the substrate. The isolation slots render that the discontinuity of the high frequency signal cross-layer transmission structure 10, the top conductive area 116, the bottom conductive area 114, the top ground plane 106, the at least one middle ground plane 104 and the bottom ground plane 102 suppresses the propagation or the resonant mode between the substrates. If a certain layer of the high frequency signal cross-layer transmission structure 10 does not have a large-area copper foil ground plane, the isolation slots become the outline/shape/appearance boundary of the high frequency signal cross-layer transmission structure 10, the top conductive area 116 and the bottom conductive area 114.

The advantage of the present invention is that the high frequency signal cross-layer transmission structure 10 has the better high frequency signal conduction characteristic in the specific frequency band.

Although the present invention has been described with reference to the preferred embodiment thereof, it will be understood that the invention is not limited to the details thereof.

Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A high frequency signal cross-layer transmission structure in a multi-layer printed circuit board, the high frequency signal cross-layer transmission structure comprising:

a bottom metal layer;

at least one middle metal layer arranged on the bottom metal layer; and a top metal layer arranged on the at least one middle metal layer, wherein the bottom metal layer comprises a bottom ground plane and a bottom conductive area; the at least one middle metal layer comprises at least one middle ground plane; the top metal layer comprises a top ground plane and a top conductive area; the bottom ground plane is configured to define a bottom annular clearance area; the bottom ground plane is configured to surround the bottom annular clearance area; the at least one middle ground plane is configured to define at least one middle clearance area; the at least one middle ground plane is configured to surround the at least one middle clearance area; the top ground plane is configured to define a top annular clearance area; the top ground plane is configured to surround the top annular clearance area; the bottom annular clearance area is configured to surround at least one part of the bottom conductive area; the top annular clearance area is configured to surround at least one part of the top conductive area; a size of the top annular clearance area is different from a size of the at least one middle clearance area, or a shape of the top annular clearance area is different from a shape of the at least one middle clearance area, to adjust an impedance characteristic of the high frequency signal cross-layer transmission structure;

wherein a size of the bottom annular clearance area is different from the size of the at least one middle clearance area, or a shape of the bottom annular clearance area is different from the shape of the at least one middle clearance area, to adjust the impedance characteristic of the high frequency signal cross-layer transmission structure;

wherein the bottom conductive area and the top conductive area are configured to define a center via hole; the bottom conductive area and the top conductive area are configured to surround the center via hole; the center via hole is through the bottom conductive area and the top conductive area; the bottom conductive area and the top conductive area are connected to each other through the center via hole, wherein the bottom ground plane, the at least one middle ground plane and the top ground plane are configured to define a plurality of ground via holes; the bottom ground plane, the at least one middle ground plane and the top ground plane are configured to surround the ground via holes; the bottom ground plane the at least one middle ground plane and the top ground plane are connected to the around via holes;

wherein the bottom metal layer is configured to define a bottom isolation slot; the at least one middle metal layer is configured to define at least one middle isolation slot; the top metal layer is configured to define a top isolation slot; the bottom isolation slot is configured to surround the bottom ground plane and the ground via holes; the at least one middle isolation slot is configured to surround the at least one middle ground plane and the ground via holes; the top isolation slot is configured to surround the top ground plane and the ground via holes.

2. The high frequency signal cross-layer transmission structure in claim 1, wherein the at least one middle ground plane is configured to define at least one radial slot in the at least one middle clearance area; the at least one middle ground plane is configured to surround the at least one radial slot.

3. The high frequency signal cross-layer transmission structure in claim 1, wherein the bottom conductive area is a transmission line structure; the top conductive area is a transmission line structure.

4. The high frequency signal cross-layer transmission structure in claim 1, wherein the high frequency signal cross-layer transmission structure is applied to an electronic component and further comprises at least one electronic component solder pad connected to the bottom conductive area or the top conductive area.

5. The high frequency signal cross-layer transmission structure in claim 1, wherein the center via hole and the ground via holes are a plurality of plated through holes.

* * * * *